(12) United States Patent
Takazawa

(10) Patent No.: US 11,536,646 B2
(45) Date of Patent: Dec. 27, 2022

(54) ELECTRONIC APPARATUS

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Masahide Takazawa, Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 210 days.

(21) Appl. No.: 16/991,910

(22) Filed: Aug. 12, 2020

(65) Prior Publication Data

US 2021/0215593 A1 Jul. 15, 2021

(30) Foreign Application Priority Data

Jan. 15, 2020 (JP) .............................. JP2020-004280

(51) Int. Cl.
| | |
|---|---|
| *G01N 17/04* | (2006.01) |
| *H05K 1/02* | (2006.01) |
| *G01N 17/00* | (2006.01) |
| *G08B 7/06* | (2006.01) |
| *G08B 21/18* | (2006.01) |

(52) U.S. Cl.
CPC ........... *G01N 17/04* (2013.01); *G01N 17/006* (2013.01); *G08B 7/06* (2013.01); *G08B 21/185* (2013.01); *H05K 1/0268* (2013.01); *H05K 2201/09227* (2013.01); *H05K 2201/09609* (2013.01)

(58) Field of Classification Search
CPC ........ G01N 17/04; G01N 17/006; G08B 7/06; G08B 21/185; H05K 1/0268; H05K 2201/09227; H05K 2201/09609; H05K 2201/0761; H05K 1/115
See application file for complete search history.

(56) References Cited

U.S. PATENT DOCUMENTS

| | | | |
|---|---|---|---|
| 8,823,535 | B2 | 9/2014 | Klein et al. |
| 9,857,411 | B2 | 1/2018 | Aoyama et al. |
| 10,242,708 | B2 | 3/2019 | Yamasaki |
| 10,863,616 | B1* | 12/2020 | Park ..................... H05K 1/0225 |
| 2014/0152449 | A1* | 6/2014 | Klein ................... H05K 1/0268 340/662 |
| 2019/0355304 | A1* | 11/2019 | Tanaka ..................... G01K 1/14 |
| 2021/0267056 | A1* | 8/2021 | Fujima .................. H05K 1/115 |
| 2021/0310972 | A1* | 10/2021 | Ito ..................... G01N 15/1031 |
| 2021/0400809 | A1* | 12/2021 | Nagasawa ............ H05K 1/0373 |

\* cited by examiner

*Primary Examiner* — Alvaro E Fortich
*Assistant Examiner* — Zannatul Ferdous
(74) *Attorney, Agent, or Firm* — Kim & Stewart LLP

(57) ABSTRACT

An electronic apparatus includes a wiring board. The wiring board also includes a first wiring pattern that is provided on the wiring board and includes a first wiring portion extending in a first direction. The wiring board further includes a second wiring pattern that includes a second wiring portion extending in the first direction. The wiring also includes a first via provided on the first wiring portion, and a second via provided on the second wiring portion. A power supply circuit applies a first voltage to the first wiring portion at periodic time intervals. A detection circuit outputs an alert signal when a current flows through the second wiring pattern.

16 Claims, 13 Drawing Sheets

US 11,536,646 B2

ELECTRONIC APPARATUS

CROSS-REFERENCE TO RELATED APPLICATION(S)

This application is based upon and claims the benefit of priority from Japanese Patent Application No. 2020-004280, filed Jan. 15, 2020, the entire contents of which are incorporated here by reference.

FIELD

Embodiments described herein relate generally to an electronic apparatus.

BACKGROUND

A wiring board of an electronic apparatus corrodes by reacting with substances in the environment. When a metal wiring is exposed to a high humidity environment containing sulfur compounds (e.g., hydrogen sulfide, sulfur oxides, or the like), a phenomenon called creep corrosion occurs in which corrosion extends from a portion at which a protective layer of the metal wiring is thin or is not provided at all, and thus corrosion products "creep" and spread along a surface of the wiring board. When creep corrosion occurs in an electronic apparatus, wirings that should not be connected to each other may become connected to each other due to the effects of corrosion, and as a result, a corrosion failure causing a device malfunction may occur due to a short circuit between the wirings.

DETAILED DESCRIPTION

Figure 1:
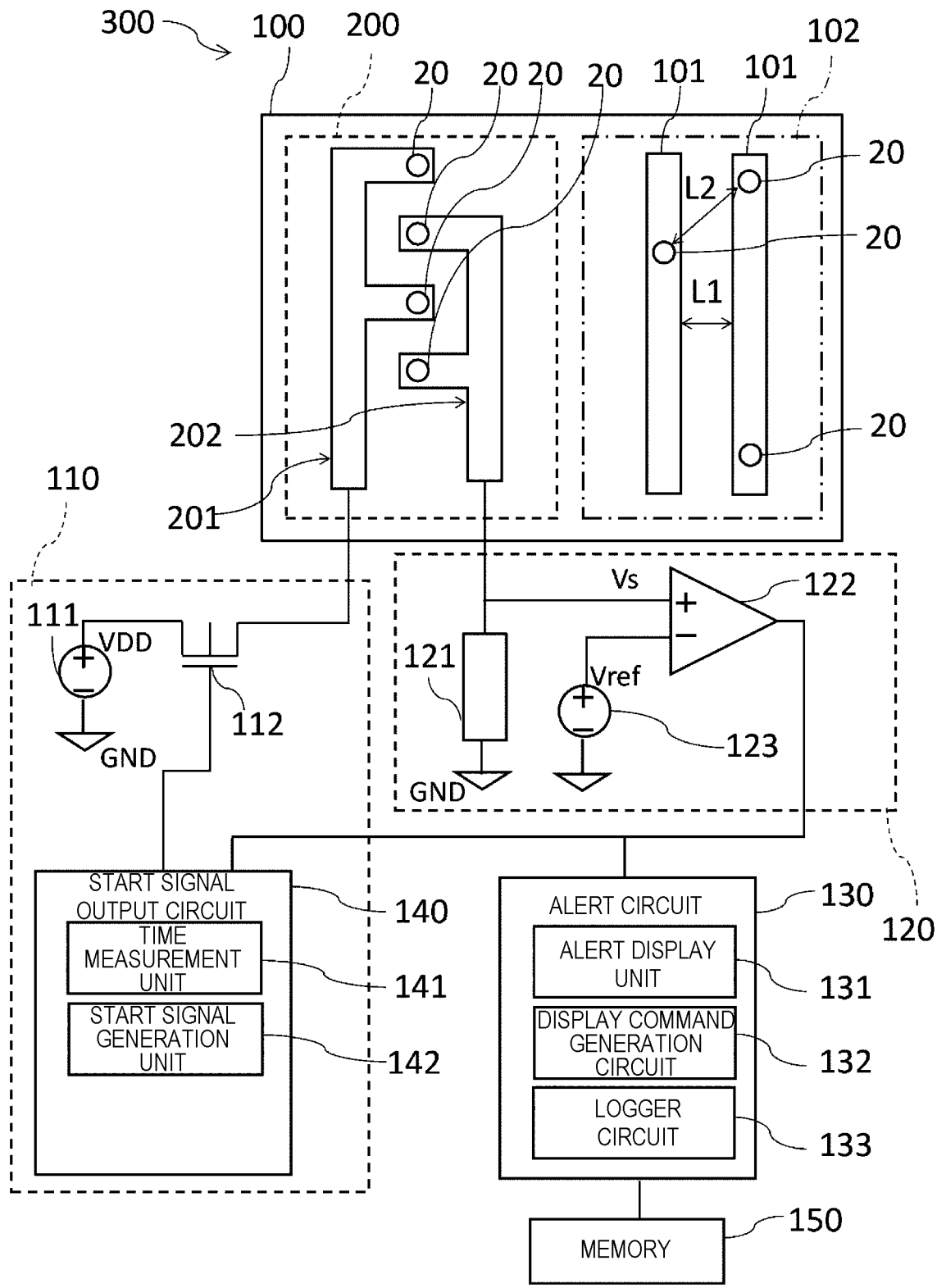
FIG. 1 is a schematic diagram of an electronic apparatus according to a first embodiment.

Example embodiments provide an electronic apparatus that detects an occurrence of corrosion on a wiring board with high sensitivity before a corrosion failure occurs.

In general, according to one embodiment, there is provided an electronic apparatus including: a wiring board, a first wiring pattern that is provided on the wiring board and includes a first wiring portion extending in a first direction, a second wiring pattern that includes a second wiring portion extending in the first direction, a first via provided on the first wiring portion, a second via provided on the second wiring portion; a power supply circuit that applies a first voltage to the first wiring portion at periodic time intervals; and a current detection circuit that outputs an alert signal when a current flows through the second wiring pattern.

Hereinafter, embodiments of the present disclosure will be described with reference to the drawings. The drawings used in descriptions of the embodiments are generally schematic diagrams. As such, for ease of the description, various shapes, dimensions, size relationships, and the like of depicted components in the drawings may be varied from those embodiments as actually implemented. In any event, such shapes, dimensions, proportions, and the like may be varied as appropriate and the effects of the present disclosure can still be obtained. For example, in the drawings, a bent portion of wiring and an intersection point between different portions of wiring are depicted as having a shape of a right-angle corner. However, these portions and connections may have different shapes, such as a shape having an obtuse-angle corner or an R-shaped curved corner. In the drawings, components having substantially similar properties, functions, and/or features are generally denoted by the same reference numerals, and repeated descriptions of these aspects may be omitted in some instances for sake of brevity.

First Embodiment

Figure 2:
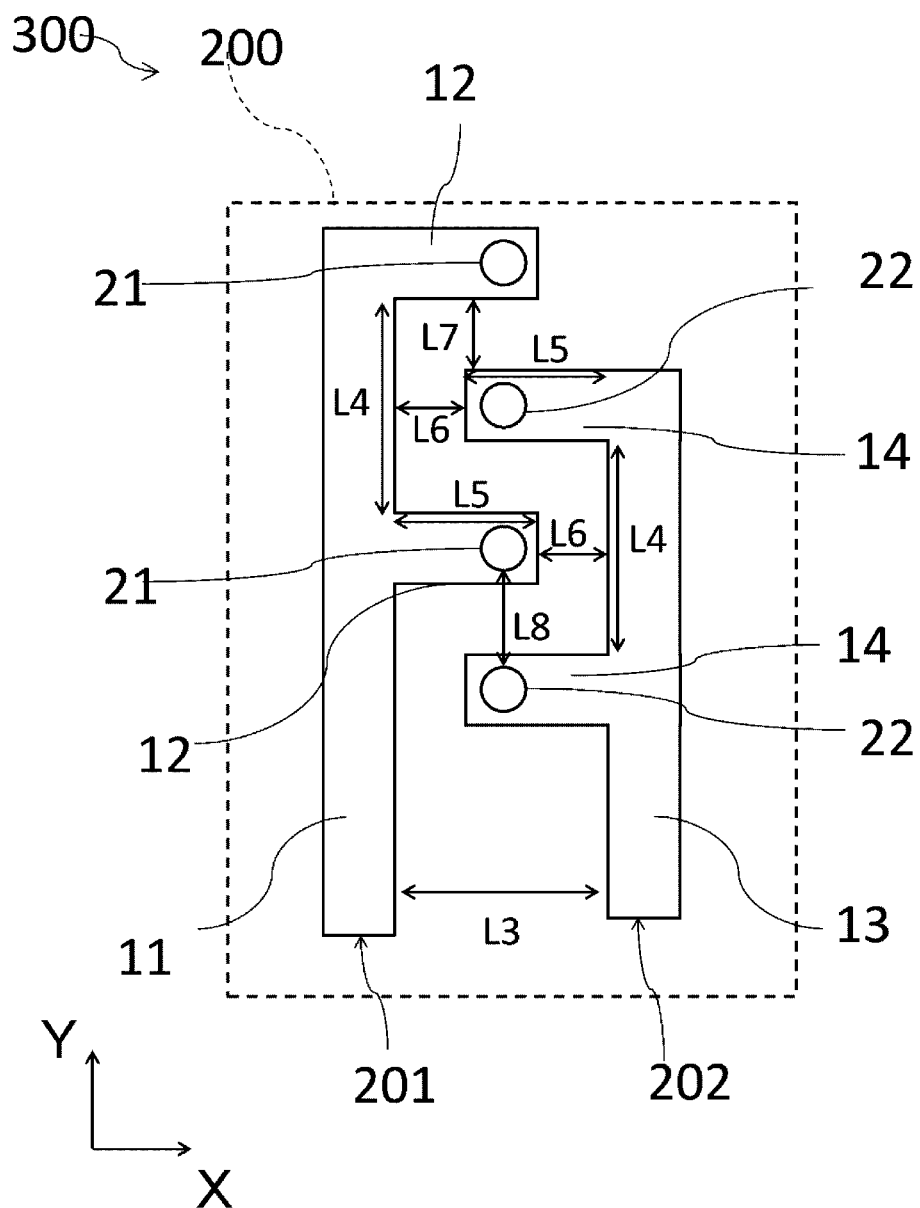
FIG. 2 is a schematic diagram illustrating a corrosion detection pattern according to a first embodiment.

A configuration of an electronic apparatus 300 according to a first embodiment will be described with reference to FIG. 1 and FIG. 2. FIG. 1 is a schematic diagram illustrating a configuration of an electronic apparatus 300 according to the first embodiment. FIG. 2 is a schematic diagram illustrating a corrosion detection pattern 200 according to the first embodiment, and is an enlarged diagram of a portion of FIG. 1.

The electronic apparatus 300 includes a wiring board 100, a power supply circuit 110, a current detection circuit 120, an alert circuit 130, and a memory 150.

The wiring board 100 is, for example, a printed circuit board. Internal circuit wirings 101, a protective layer 102, and a corrosion detection pattern 200 are provided on the wiring board 100. When the electronic apparatus 300 includes a housing and one surface of the wiring board 100 is attached/mounted to the housing, the corrosion detection pattern 200 is generally provided on the opposite surface of the wiring board 100. A direction parallel to the surface of the wiring board 100 is defined as an X direction, and another direction parallel to the surface of the wiring board 100 and orthogonal to the X direction is defined as a Y direction.

The internal circuit wirings 101 are a plurality of wirings of an internal circuit of the electronic apparatus 300, and are, for example, signal wirings and power supply lines for operating the electronic apparatus 300. The internal circuit wirings 101 may be two wirings to which differential signals are input and that are adjacent to each other in a parallel relationship to each other. Further, the internal circuit wirings 101 may be two or more wirings to which different voltages or different signals are supplied. The wirings of the internal circuit wirings 101 are formed on a first surface of the wiring board 100 using metal foil of, for example, copper, silver, nickel, or the like. Metal plating may be applied on a upper surface of the metal foil. There is a gap with at least a width L1 between the adjacent internal circuit wirings 101. In FIG. 1, a distance between two wirings extending in parallel is illustrated as a width L1. Vias 20 may be provided on the internal circuit wiring 101. The vias 20, which are provided on the adjacent two internal circuit wirings 101, are separated from each other by a length L2. When corrosion occurs in the internal circuit wirings 101 and the internal circuit wirings 101 are short-circuited by corrosion products, a corrosion error, occurs, and this causes an abnormal operation (or failure) of the electronic apparatus 300.

The protective layer 102 is provided on the wiring board 100 so as to cover the internal circuit wirings 101. That is, the internal circuit wirings 101 are provided between the wiring board 100 and the protective layer 102. Thereby, the protective layer 102 protects the internal circuit wirings 101 from the atmosphere found inside the electronic apparatus 300. The internal circuit wirings 101 are generally unlikely to corrode because the internal circuit wirings 101 are shielded from substances, such as sulfur compounds and water, in the atmosphere that cause corrosion. The protective layer 102 is made of, for example, an insulating resin material formed on the internal circuit wirings 101 of the wiring board 100, but is not limited thereto.

The corrosion detection pattern 200 is a wiring pattern formed of the same metal foil as the internal circuit wirings 101. The corrosion detection pattern 200 includes a first wiring pattern 201 and a second wiring pattern 202. The first wiring pattern 201 is electrically connected to the power supply circuit 110. The second wiring pattern 202 is electrically connected to the current detection circuit 120. The first wiring pattern 201 and the second wiring pattern 202 are separated from each other on the wiring board 100. When the first wiring pattern 201 and the second wiring pattern 202 are short-circuited due to corrosion, that is, when the first wiring pattern 201 and the second wiring pattern 202 are short-circuited by corrosion products, the first wiring pattern 201 and the second wiring pattern 202 become electrically connected to each other. The corrosion detection pattern 200 is provided on the wiring board 100 so as to be left exposed (that is, not covered) by the protective layer 102.

The power supply circuit 110 illustrated in FIG. 1 is implemented by a first power supply 111 that supplies a power supply voltage VDD, a transistor 112, and a start signal output circuit 140.

The start signal output circuit 140 controls a timing of a corrosion inspection by outputting a start signal every time a time equal to or longer than a predetermined time T1 has elapsed. The start signal output circuit 140 includes a time measurement unit 141 and a start signal generation unit 142.

The time measurement unit 141 is a circuit that measures an elapsed time T from the previous corrosion inspection and determines whether or not a predetermined time T1 has elapsed (T>T1), and thus performs a periodic time measurement at each elapsed time T after the most recent corrosion inspection has taken place. The predetermined time T1 is, for example, one day or one week.

The start signal generation unit 142 is a circuit that generates a start signal and outputs the start signal to the transistor 112 when the time measurement unit 141 determines that the elapsed time T exceeds the predetermined time T1. The start signal generation unit 142 can output a start signal at a certain timing such as a timing when the electronic apparatus 300 is operated, in addition to the timing when the elapsed time T exceeds the predetermined time T1. The start signal is a pulse signal that is output with a short time length.

The power supply circuit 110 applies the power supply voltage VDD to the first wiring pattern 201 when the start signal is output, and applies a ground voltage GND to the first wiring pattern 201 when the start signal is not output. The power supply circuit 110 generates a voltage between the first wiring pattern 201 and the second wiring pattern 202 by applying the power supply voltage VDD to the first wiring pattern 201. In this specification, it is described that the power supply voltage VDD is higher than the ground voltage GND. On the other hand, the power supply voltage VDD may be lower than the ground voltage GND.

The first power supply 111 supplies the power supply voltage VDD. In the transistor 112, a gate is electrically connected to the start signal output circuit 140, one of a source and a drain is electrically connected to the power supply voltage VDD supplied by the first power supply 111, and the other of the source and the drain is electrically connected to the first wiring pattern 201. The transistor 112 is turned on when the start signal is input from the start signal output circuit 140, and is turned off when the start signal is not being input.

The power supply circuit 110 is not limited to the configuration in FIG. 1 and may be varied in configuration so long as the power supply circuit 110 can apply the power supply voltage VDD at a timing corresponding to an input of the start signal. In one example, one of the source and the drain of the transistor 112 may be connected to the ground voltage through a resistor. In another example, the power supply circuit 110 may be implemented by an operational amplifier. Further, in another example, the power supply circuit 110 may be configured to be electrically connected to both of the first wiring pattern 201 and the second wiring pattern 202 and to apply different voltages to each wiring pattern.

The current detection circuit 120 detects a current flowing between the first wiring pattern 201 and the second wiring pattern 202 when a voltage is applied between the first wiring pattern 201 and the second wiring pattern 202, and outputs a current detection signal according to a detection state. The current detection circuit 120 includes, for example, a resistor 121, a comparator 122, and a second power supply 123.

The second power supply 123 supplies a reference voltage Vref higher than the ground voltage GND. One end of the resistor 121 is electrically connected to the second wiring pattern 202, and the other end of the resistor 121 is electrically connected to the ground voltage GND. One input terminal of the comparator 122 is electrically connected to the one end of the resistor 121, the other input terminal of the comparator 122 is electrically connected to the reference voltage Vref supplied by the second power supply 123, and an output terminal of the comparator 122 is electrically connected to the alert circuit 130. Hereinafter, a voltage of the one end of the resistor 121 is represented as an inspection voltage Vs.

The current between the first wiring pattern 201 and the second wiring pattern 202 flows to the ground voltage through the resistor 121. The resistor 121 increases the inspection voltage Vs to a value higher than the reference voltage Vref by converting the current flowing between the first wiring pattern 201 and the second wiring pattern 202 into a voltage. The comparator 122 compares the inspection voltage Vs and the reference voltage Vref, and outputs, from the output terminal, a current detection signal indicating whether or not a current flows between the first wiring pattern 201 and the second wiring pattern 202. When a current flows between the first wiring pattern 201 (or a first wiring portion 11) and the second wiring pattern 202 (or a third wiring portion 13), that is, when the inspection voltage Vs is higher than the reference voltage Vref, the comparator 122 outputs a current detection signal having a high voltage. When a current does not flow between the first wiring pattern 201 and the second wiring pattern 202, that is, when the inspection voltage Vs is lower than the reference voltage Vref, the comparator 122 does not output a current detection signal.

The comparator 122 may output a current detection signal having a low voltage when the inspection voltage Vs is lower than the reference voltage Vref. The comparator 122 may invert a relationship between the presence or absence of current detection and a value of the output current detection signal. That is, the comparator 122 may output a current detection signal having a high voltage when a current does not flow between the first wiring pattern 201 and the second wiring pattern 202, and output a current detection signal having a low voltage when a current flows between the first wiring pattern 201 and the second wiring pattern 202.

When the current detection signal is input from the current detection circuit 120, the alert circuit 130 outputs an alert, and notifies a user that the first wiring pattern 201 and the second wiring pattern 202 are short-circuited, that is, that corrosion occurs in the electronic apparatus 300 and a corrosion error may occur. The alert circuit 130 does not output an alert when the current detection signal is not input.

The alert circuit 130 includes, for example, an alert display unit 131 such as a lamp or a speaker, and may directly notify a user that corrosion occurs in the electronic apparatus 300 by changing a lighting state or a sound output state of the alert display unit 131.

When the electronic apparatus 300 is connected to an external apparatus, the alert circuit 130 may include a display command generation circuit 132. The display command generation circuit 132 can transmit a display command causing the external apparatus to display an alert to a user, and indirectly notify a user that corrosion occurs in the electronic apparatus 300 through the external apparatus.

A logger circuit 133 is connected to the memory 150 and records, in the memory 150, a log indicating that the current detection signal was previously input. By examining the log, a user can confirm that corrosion occurs in the electronic apparatus 300 and that a corrosion error may occur soon. The alert circuit 130 may cause the external apparatus to display the log recorded in the memory 150 through the display command generation circuit 132.

As an alert notification unit of the alert circuit 130, any one of the alert display unit 131, the display command generation circuit 132, and the logger circuit 133 may be used, or one or more of these circuits/units may be used in combination with another unit.

The power supply circuit 110, the current detection circuit 120, and the alert circuit 130 described above can be implemented as a one-chip, integrated circuit.

A configuration of the corrosion detection pattern 200 according to the first embodiment will be described with reference to FIG. 2. FIG. 2 is a schematic diagram illustrating the corrosion detection pattern 200 according to the first embodiment.

The corrosion detection pattern 200 is disposed at a position where the corrosion detection pattern 200 is readily exposed to the atmosphere inside the electronic apparatus 300 or, alternatively, at a position where the corrosion detection pattern 200 is exposed to the outside air (ambient environment of the electronic apparatus 300). Thus, detection sensitivity of corrosion can be improved. Alternatively, when the corrosion detection pattern 200 is provided near the internal circuit wirings 101, corrosion may occur under a condition similar to the condition of the internal circuit wirings 101.

The first wiring pattern 201 and the second wiring pattern 202 have a comb shape. The first wiring pattern 201 includes a first wiring portion 11 and a plurality of second wiring portions 12 that are orthogonal to the first wiring portion 11. The second wiring pattern 202 includes a third wiring portion 13 and a plurality of fourth wiring portions 14 that are orthogonal to the third wiring portion 13.

The first wiring portion 11 extends in the Y direction. The first wiring portion 11 is electrically connected to the power supply circuit 110.

The third wiring portion 13 extends in the Y direction, and faces the first wiring portion 11. The third wiring portion 13 is separated from the first wiring portion 11 by a length L3 in the X direction. The third wiring portion 13 is electrically connected to the current detection circuit 120.

One end of the second wiring portion 12 is referred to as a base end, and the other end of the second wiring portion 12 is referred to as a tip end. The second wiring portion 12 is separated from the adjacent second wiring portion 12 by a length L4 in the Y direction, and the base end of the second wiring portion 12 is connected to the first wiring portion 11. The distance between adjacent wiring portions is a gap between adjacent wiring portions in a direction orthogonal to a length direction of one of the wiring portions. The second wiring portion 12 extends by a length L5 from a position at which the second wiring portion 12 is connected to the first wiring portion 11 toward the third wiring portion 13 in the X direction. The third wiring portion 13 is provided on the tip end side of the second wiring portion 12 to be separated by a length L6 in the X direction. FIG. 2 illustrates an example in which two second wiring portions 12 are provided, and three or more second wiring portions 12 may alternatively be provided.

One end of the fourth wiring portion 14 is referred to as a base end, and the other end of the fourth wiring portion 14 is referred to as a tip end. The fourth wiring portion 14 is separated from the adjacent fourth wiring portion 14 by a length L4 in the Y direction, and the base end of the fourth wiring portion 14 is connected to the third wiring portion 13. The fourth wiring portion 14 extends by a length L5 from a position at which the fourth wiring portion 14 is connected to the third wiring portion 13 toward the first wiring portion 11 in the X direction. The first wiring portion 11 is provided on the tip end side of the fourth wiring portion 14 to be separated by a length L6 in the X direction. FIG. 2 illustrates an example in which two fourth wiring portions 14 are provided, and three or more fourth wiring portions 14 may alternatively be provided.

In the first embodiment, a portion of one wiring pattern is provided between two wiring portions of another wiring pattern that extend in the same direction. That is, the fourth wiring portion 14 is provided between the adjacent second wiring portions 12, and the second wiring portion 12 is provided between the adjacent fourth wiring portions 14. In other words, the second wiring portions 12 and the fourth wiring portions 14 are alternately provided in the Y direction. The second wiring portion 12 and the fourth wiring portion 14, which are adjacent to each other, are separated by a length L7 in the Y direction. The length L7 is a distance between adjacent wirings, that is, a clearance. The length L7 is, for example, a minimum inter-conductor distance defined in the wiring board 100.

A via 21 is provided on the second wiring portion 12. A via 22 is provided on the fourth wiring portion 14. The vias 21 and 22 are, for example, through via holes penetrating the wiring board 100. The same metal foil as the second wiring portion 12 and the fourth wiring portion 14 is formed on edge portions and inner wall portions of the vias 21 and 22. In the first embodiment, the vias 21 and 22 are respectively provided one by one at the tip ends of the second wiring portion 12 and the fourth wiring portion 14, and are linearly arranged in one row in the Y direction. The via 21 and the via 22 are separated by a length L8. The length L8 satisfies the relationship $0.5 \times L8 \leq L1$, and thus one-half of the length L8 is shorter than the length L1. The length L8 also satisfies $L8 \leq L2$, and thus is shorter than the length L2.

Figure 3:
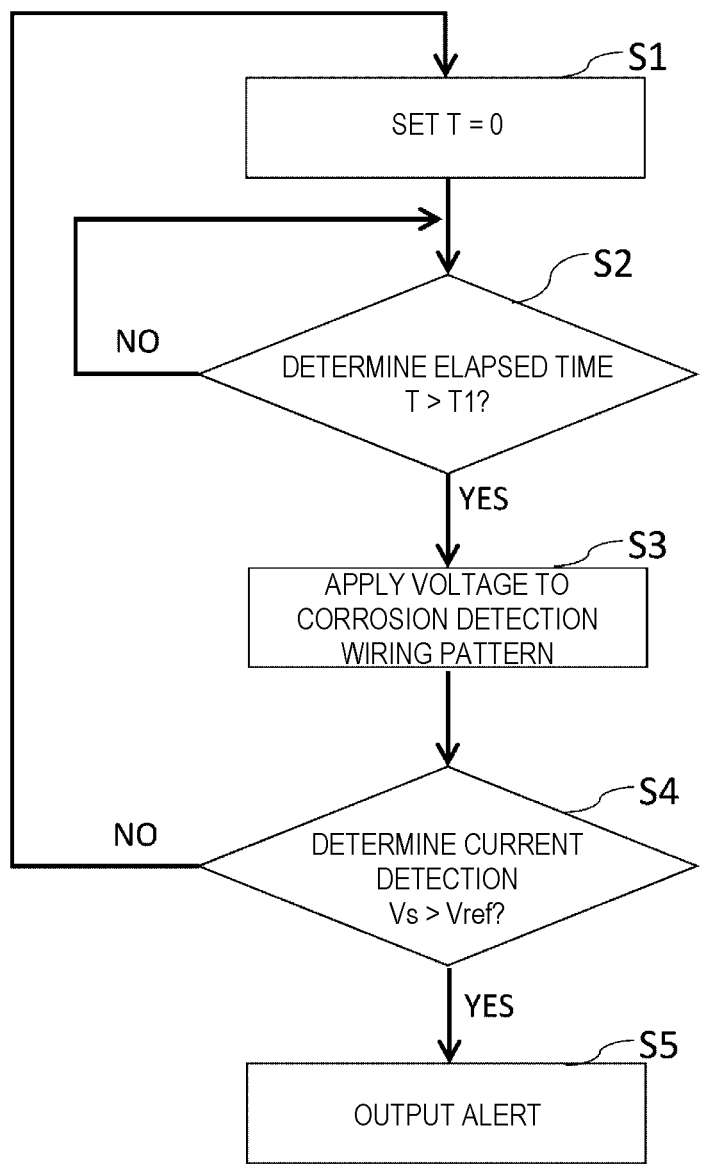
FIG. 3 is a flowchart explaining a corrosion inspection method according to a first embodiment.

A procedure of a corrosion inspection in which the electronic apparatus 300 detects whether or not corrosion occurs in the wiring board 100 will be described with reference to FIG. 3. FIG. 3 is a flowchart illustrating a procedure of corrosion detection.

First, in step S1, an elapsed time T to be measured by the time measurement unit 141 of the start signal output circuit 140 is set to 0. The time measurement unit 141 measures the elapsed time T.

Next, in step S2, the time measurement unit 141 determines whether the elapsed time T exceeds a predetermined time T1. When T>T1, that is, when the elapsed time T exceeds the predetermined time T1 (YES), the procedure proceeds to step S3. When T<T1, that is, when the elapsed time T does not exceed the predetermined time T1 (NO), the procedure returns to the beginning of step S2.

Next, in step S3, the start signal output circuit 140 outputs a start signal to the gate of the transistor 112. The transistor 112 is temporarily turned on when a start signal as a pulse signal is input, and applies the power supply voltage VDD to the first wiring pattern 201. Thus, a voltage is generated between the first wiring pattern 201 and the second wiring pattern 202. When the first wiring pattern 201 and the second wiring pattern 202 are short-circuited due to corrosion, a current flows between the first wiring pattern 201 and the second wiring pattern 202, and the current is converted into a voltage by the resistor 121. At this time, an inspection voltage Vs increases. When the first wiring pattern 201 and the second wiring pattern 202 are not short-circuited, a current does not flow between the first wiring pattern 201 and the second wiring pattern 202. At this time, the inspection voltage Vs has a value equal to the ground voltage GND.

Next, in step S4, the current detection circuit 120 determines whether or not a current flows between the first wiring pattern 201 and the second wiring pattern 202.

When the inspection voltage Vs is higher than the reference voltage Vref, the current detection circuit 120 determines that a current flows between the first wiring pattern 201 and the second wiring pattern 202 (YES). When a current flows between the first wiring pattern 201 and the second wiring pattern 202, it can be understood that a short circuit due to corrosion occurs in the corrosion detection pattern 200, and thus corrosion occurs in the wiring board 100. When a determination result in step S4 is YES, the current detection circuit 120 outputs a current detection signal from the output terminal of the comparator 122, and the procedure proceeds to step S5.

When the inspection voltage Vs is lower than the reference voltage Vref, the current detection circuit 120 determines that a current does not flow between the first wiring portion 11 and the third wiring portion 13 (NO). When a current does not flow between the first wiring pattern 201 and the second wiring pattern 202, it can be understood that a short circuit due to corrosion does not occur at least in the corrosion detection pattern 200. When the determination result in step S4 is NO, the current detection circuit 120 returns to step S1 without outputting a current detection signal from the output terminal of the comparator 122.

Finally, in step S5, the alert circuit 130 outputs an alert when the current detection signal is input. In the example illustrated in FIG. 3, the corrosion inspection is ended in step S5. After step S5 is completed, by returning the procedure to step S1 or step S3, the corrosion inspection can be further continued. It is noted that the corrosion inspection can be further continued by returning the procedure to step S1 or step S3 after step S5 is completed. When the alert is received, a user can recognize that corrosion occurs in the electronic apparatus 300. The user may stop the electronic apparatus 300 in a safe manner or repair the electronic apparatus 300 before a corrosion error occurs.

In the example illustrated in FIG. 3, the corrosion inspection is ended in step S5. It is noted that the corrosion inspection can be further continued by returning the procedure to step S1 or step S3 after step S5 is completed. When the determination result in step S4 is YES, step S3 and step S4 may be repeated by an output of a start signal from the start signal output circuit 140. On the other hand, when the determination result in step S4 is YES a predetermined number of times, an alert may be output.

The following describes that the electronic apparatus 300 can accurately detect a short circuit between wirings due to corrosion, that is, an occurrence of corrosion.

When a voltage is generated between adjacent wirings on the wiring board 100, a phenomenon called ion migration (or electrochemical migration), in which a short circuit occurs due to movement of ionized metal between the adjacent wirings, occurs. One of causes of ion migration is that a voltage is generated between adjacent wirings for a long time. When ion migration occurs in the corrosion detection pattern 200, even when corrosion does not occur on the wiring board 100, a current flows between the first wiring pattern 201 and the second wiring pattern 202, and as a result, a corrosion inspection result may be incorrect.

In the first embodiment, a start signal is output from the start signal output circuit 140 every time a predetermined time is elapsed, and thus the corrosion inspection is performed. Since a voltage is not always applied between the first wiring pattern 201 and the second wiring pattern 202 but is temporarily applied every time a predetermined time is elapsed, ion migration is unlikely to occur. In the first embodiment, the corrosion inspection is performed while preventing an occurrence of ion migration, and thus only a short circuit due to corrosion, that is, only an occurrence of corrosion, can be accurately detected.

Figure 4:
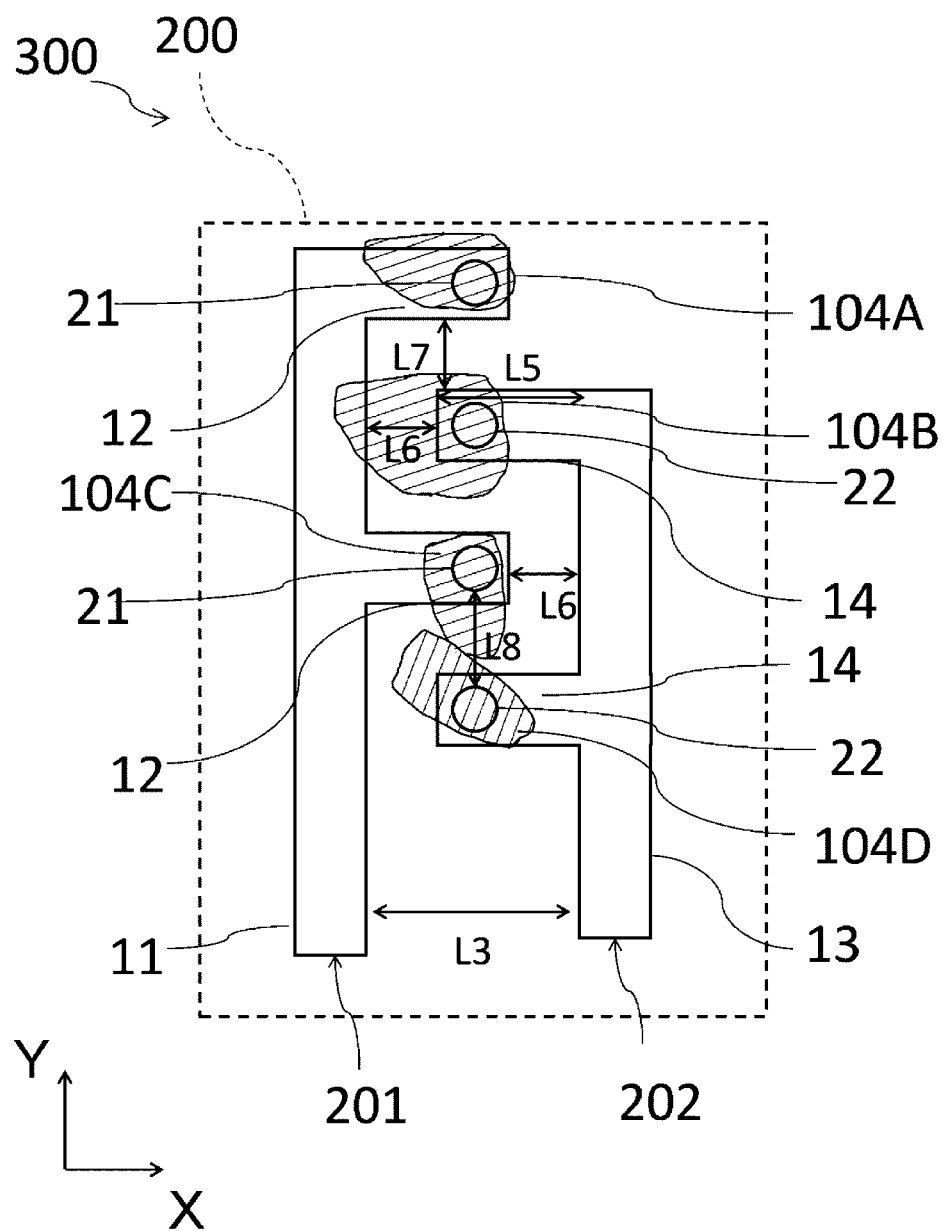
FIG. 4 is a schematic diagram illustrating a corrosion detection pattern according to a first embodiment in which wiring corrosion occurs.

FIG. 4 is a schematic diagram illustrating the corrosion detection pattern 200 according to the first embodiment in which corrosion occurs. In FIG. 4, corrosion products generated from the vias 21 and 22 are denoted by reference numerals 104A, 104B, 104C, and 104D in the Y direction in order. On the wiring board 100, directions in which the corrosion products grow, that is, directions and shapes in which the corrosion products 104A, 104B, 104C, and 104D generated from the vias 21 and 22 extend are not constant.

As illustrated in FIG. 2 and FIG. 4, on the tip end sides of the second wiring portion 12 and the fourth wiring portion 14 in the X direction and the Y-direction, the wiring portions of the other wiring pattern are provided. That is, the third wiring portion 13 is provided on the tip end side of the second wiring portion 12 in the X direction, and the fourth wiring portion 14 is provided on the tip end side of the second wiring portion 12 in the Y direction. The first wiring portion 11 is provided on the tip end side of the fourth wiring portion 14 in the X direction, and the second wiring portion 12 is provided on the tip end side of the fourth wiring portion 14 in the Y direction. For example, when corrosion occurs on one wiring pattern, such as the corrosion product 104B, there is the other wiring pattern in which corrosion is grown, and as a result, the corrosion detection pattern is short-circuited. When corrosion occurs in the second wiring portion 12 and the fourth wiring portion 14, whether the corrosion grows in the Y direction or on the tip end side in the X direction, the corrosion product can be brought into contact with the other wiring pattern. In other words, the electronic apparatus 300 includes the corrosion detection pattern 200 having a shape in which, when corrosion occurs in the second wiring portion 12 and the fourth wiring portion 14, an occurrence of a short circuit is unlikely to be influenced by deviation of a growth direction of the corrosion. Therefore, the electronic apparatus 300 can detect a short circuit due to corrosion, that is, an occurrence of corrosion with high accuracy.

As described above, the electronic apparatus 300 can accurately detect an occurrence of corrosion by preventing an influence of ion migration and an influence of deviation of a growth direction of corrosion.

The following describes that corrosion is more likely to occur in the corrosion detection pattern 200 than in the internal circuit wirings 101. In the corrosion inspection, a short circuit due to corrosion occurred in the corrosion detection pattern 200 is detected. Therefore, when corrosion is more likely to occur in the corrosion detection pattern 200, corrosion detection sensitivity of the corrosion inspection can be improved.

The internal circuit wirings 101 are covered with the protective layer 102, and are unlikely to come into contact with substances (sulfur compounds, water, and the like) causing corrosion in the atmosphere. On the other hand, since the corrosion detection pattern 200 is exposed to the atmosphere without the protective layer 102, the corrosion detection pattern 200 is likely to come into contact with substances included in the atmosphere and causing corrosion. For this reason, corrosion is likely to occur and grow in the corrosion detection pattern 200 before corrosion occurs in the internal circuit wirings 101. Thus, detection that a short circuit due to corrosion is likely to occur in internal circuit wirings 101 at some future point in time can be made before such corrosion actually causes a fault in internal circuit wirings 101.

As illustrated in FIG. 4, corrosion of the wiring board 100 is likely to occur and grow from the inner walls and edges of openings of the vias 21 and 22. It is considered that this is because fine particles serving as nuclei are likely to be attached to the vias 21 and 22 and water droplets (condensation) causing corrosion are likely to be formed. The second wiring portion 12 and the fourth wiring portion 14 not only detect corrosion with high accuracy but also include the vias 21 and 22. Thus, corrosion is likely to occur in the second wiring portion 12 and the fourth wiring portion 14.

In addition, not only by providing the vias 21 and 22 in the second wiring portion 12 and the fourth wiring portion 14, but also by increasing the number of the second wiring portions 12 and the fourth wiring portions 14 provided in the corrosion detection pattern 200 or by increasing the lengths L5 of the second wiring portion 12 and the fourth wiring portion 14 in the X direction, a possibility of an occurrence of corrosion can be increased.

As described above, since corrosion is likely to occur in the corrosion detection pattern 200 that is exposed from the protective layer 102 and on which the vias 21 and 22 are provided, the electronic apparatus 300 can detect an occurrence of corrosion with high sensitivity.

The following describes that, when corrosion occurs, the corrosion detection pattern 200 is short-circuited at a timing earlier than a timing at which the internal circuit wirings 101 are short-circuited (before a corrosion error occurs). Since the corrosion detection pattern 200 is quickly short-circuited, the electronic apparatus 300 can detect corrosion with high sensitivity before a corrosion error occurs.

A short circuit between adjacent wirings may also be caused by a contact between the corrosion product generated on the first wiring pattern 201 and the corrosion product generated on the second wiring pattern 202. In FIG. 4, the corrosion product 104C and the corrosion product 104D come into contact with each other, and as a result, a short circuit between the wiring patterns occurs.

In the first embodiment, the via 21 and the via 22 are linearly provided side by side to be separated from each other by the length L8 in the Y direction. Since the via 21 and the via 22 are linearly provided side by side in the Y direction, the via 21 and the via 22 are close to each other. In the corrosion detection pattern 200, when two corrosion products, which are generated at the edges of the adjacent two vias 21 and 22, are grown by a total length of L8 (0.5×L8 per corrosion product) at the shortest, the two wiring patterns may be short-circuited.

It is assumed that corrosion occurs in both of the vias 20 of the internal circuit wirings 101 and the vias 21 and 22 of the corrosion detection pattern 200 at the same timing. At this time, in the corrosion inspection, before the corrosion product generated from the via 20 provided on a certain internal circuit wiring 101 comes into contact with an adjacent internal circuit wiring 101 (before a corrosion error occurs), a short circuit due to corrosion needs to occur in the corrosion detection pattern. In other words, before the corrosion product generated from the via 20 of the internal circuit wiring 101 grows by the length L1 toward the adjacent internal circuit wiring 101, the corrosion product generated from each of the vias 21 and 22 of the corrosion detection pattern 200 needs to grow by at least a length of 0.5×L8. Assuming that a growth speed of the corrosion on the wiring board 100 is constant, since 0.5×L8≤L1 at the minimum, corrosion can be detected before a corrosion error occurs.

Further, the corrosion products generated from the two vias 20, which are provided on the adjacent internal circuit wirings 101, may come into contact with each other. Before the corrosion product generated from each of the two vias 20 provided on the adjacent internal circuit wirings 101 grows by a length of 0.5×L2 at the least, the corrosion product generated from each of the vias 21 and 22 of the corrosion detection pattern 200 needs to grow by a length of 0.5×L8 at the least. That is, since L8≤L2, at the minimum, corrosion can be detected before a corrosion error occurs.

By making a gap (the length L6 or the length L7) between the first wiring pattern 201 and the second wiring pattern 202 narrower than a gap (the length L1) between the adjacent internal circuit wirings 101, a short circuit between the wirings due to corrosion is more likely to occur in the corrosion detection pattern 200 than in the internal circuit wirings 101.

By making the lengths L6 and L7 and the length L1 have the same value, a timing at which corrosion is detected by the corrosion detection pattern 200 and a timing at which a short circuit due to corrosion occurs in the corrosion detection pattern 200 earlier than in the internal circuit wirings 101 can be close to each other. Alternatively, by making the lengths L6 and L7 longer than the length L1 within a range satisfying 0.5×L8≤L1 and L8≤L2, detection sensitivity of corrosion and a detection timing of corrosion can be adjusted.

As described above, in the electronic apparatus 300, the distance between the wiring patterns of the corrosion detection pattern 200 or the distance between the vias of the corrosion detection pattern 200 is shorter than the distance in the internal circuit wirings 101. Therefore, a short circuit occurs in the corrosion detection pattern 200 at an earlier timing than in the internal circuit wirings 101.

As described above, the electronic apparatus 300 according to the first embodiment includes the corrosion detection pattern 200. The detection pattern 200 includes the first wiring pattern 201 and the second wiring pattern 202, on which the vias 21 and 22 are respectively provided. The electronic apparatus 300 applies a voltage between the first wiring pattern 201 and the second wiring pattern 202 every time a predetermined increment of time is elapsed, and determines at these times whether or not a current flows between the two wiring patterns (201 and 202). Therefore, the electronic apparatus 300 can detect an occurrence of a short circuit due to corrosion. The electronic apparatus 300 can accurately detect a short circuit due to corrosion by preventing ion migration and an influence of a growth direction of corrosion. Since the corrosion detection pattern 200 is left exposed from the protective layer 102 and is provided with the vias 21 and 22, corrosion is generally more likely to occur in the corrosion detection pattern 200 than in the internal circuit wirings 101. Thus, a short circuit due to corrosion is more likely to occur first in the detection pattern 200 than in the operational circuits of the electronic device 300. Therefore, the electronic apparatus 300 can anticipate corrosion failures before a corrosion error actually occurs in the electronic device. When a short circuit in the corrosion detection pattern 200 is detected, the electronic apparatus 300 can notify a user that corrosion has (or may have) occurred inside the electronic apparatus 300 by outputting an alert from the alert circuit 130.

According to the first embodiment, it is possible to provide an electronic apparatus capable of detecting, with high sensitivity, an occurrence of corrosion on a wiring board before a corrosion error occurs in an operational device circuit by detection of a short circuit due to corrosion in a corrosion monitoring circuit.

When the electronic apparatus 300 has a corrosion inspection function, a shape and an area of a mounting space for the corrosion detection pattern 200 may be limited according to the configuration of the electronic apparatus 300. The shape of the corrosion detection pattern 200 can be changed according to the mounting space, and it is possible to adjust the detection sensitivity of corrosion by changing the shape (s) of elements in the corrosion detection pattern 200.

Hereinafter, various modification examples of the first embodiment, in which the shape and the configuration of the corrosion detection pattern are different from those in the first embodiment, will be described with reference to the drawings. The same components as those in the first embodiment are denoted by the same reference numerals, and a description thereof will be omitted. For convenience of descriptions of the drawings, vertical and horizontal ratios in the different drawings do not always match with each other.

Modification Example 1

Figure 5:
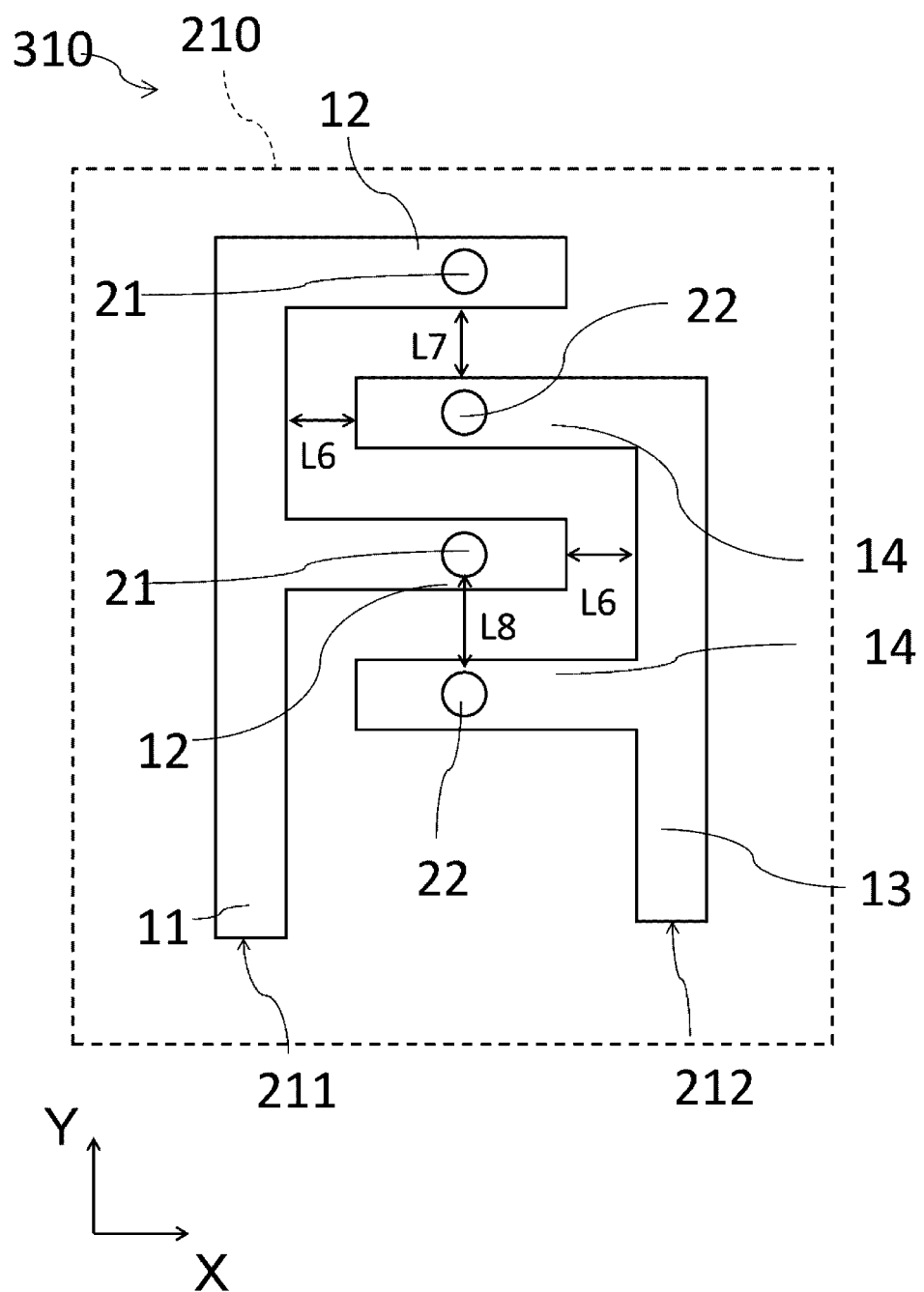
FIG. 5 is a schematic diagram illustrating a corrosion detection pattern according to a first modification example of a first embodiment.

FIG. 5 is a schematic diagram illustrating a corrosion detection pattern 210 of an electronic apparatus 310 according to a modification example 1. The corrosion detection pattern 210 according to the modification example 1 is different from the corrosion detection pattern 200 according to the first embodiment in that the via 21 is provided between the tip end and the base end of the second wiring portion 12 and that the via 22 is provided between the tip end and the base end of the fourth wiring portion 14.

By using the corrosion detection pattern 210 according to the modification example 1, similarly to the first embodiment, it is possible to provide the electronic apparatus 310 that detects corrosion with high sensitivity before a corrosion error occurs.

Modification Example 2

Figure 6:
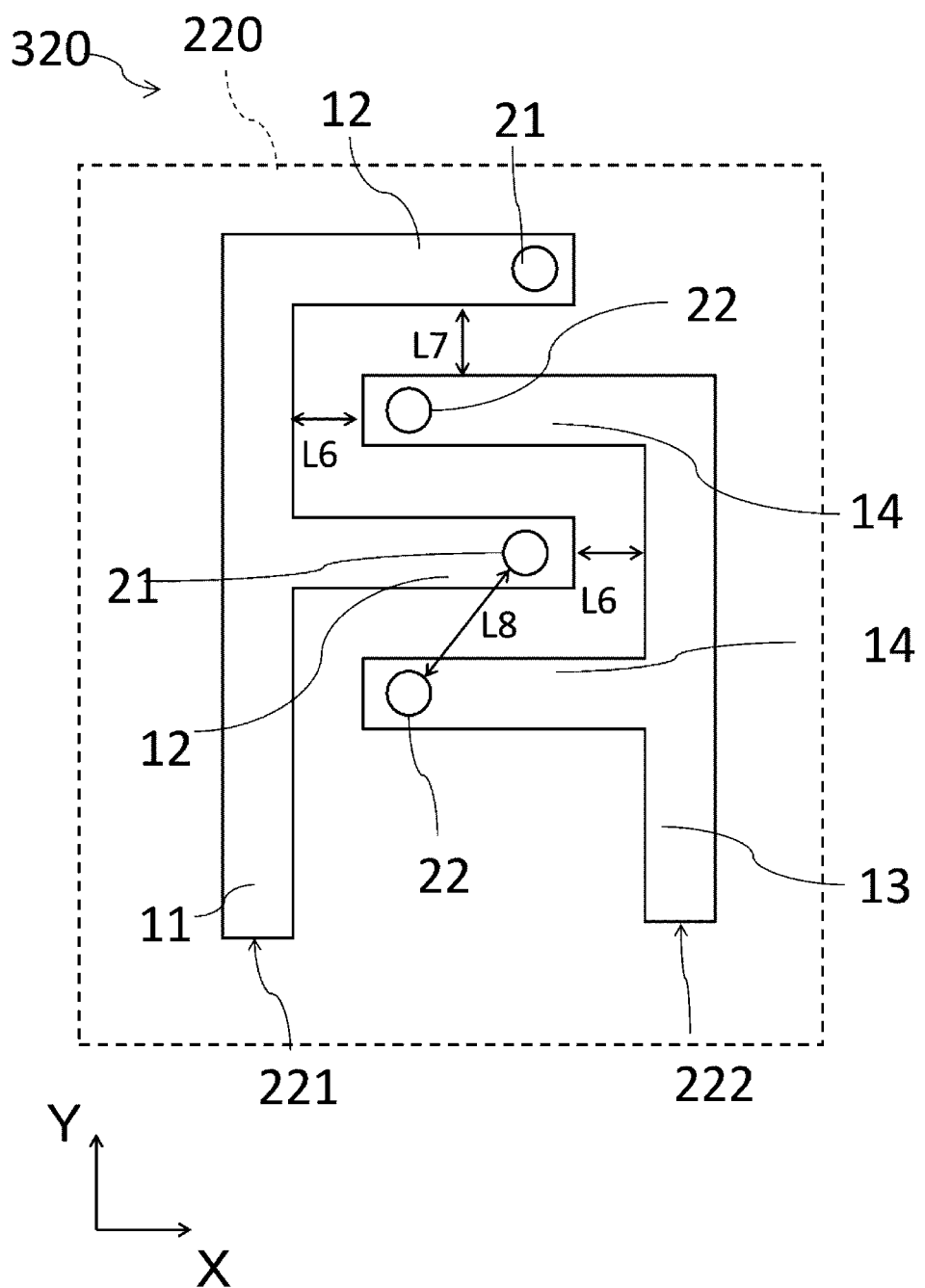
FIG. 6 is a schematic diagram illustrating a corrosion detection pattern according to a second modification example of a first embodiment.

FIG. 6 is a schematic diagram illustrating a corrosion detection pattern 220 of an electronic apparatus 320 according to a modification example 2. The corrosion detection pattern 220 according to the modification example 2 is different from the corrosion detection pattern 200 according to the first embodiment in that the vias 21 of the second wiring portion 12 and the vias 22 of the fourth wiring portion 14 are provided in a staggered manner.

The vias 21 of the second wiring portion 12 are provided side by side in the Y direction. The vias 22 of the fourth wiring portion 14 are provided side by side in the Y direction at positions away from the vias 21 of the second wiring portion 12 in the X direction. FIG. 6 illustrates an example in which the vias 21 of the second wiring portion 12 are located closer to the first wiring portion 11 than the vias 22 of the fourth wiring portion 14 are located. On the other hand, the vias 21 of the second wiring portion 12 may be located closer to the third wiring portion 13 than the vias 22 of the fourth wiring portion 14 are located. In the corrosion detection pattern 220, since the vias 21 and 22 are provided in a staggered manner, it is possible to adjust the length L8 as a gap between the vias 21 and 22 by changing the positions of the vias 21 and 22 in the X direction. That is, in the corrosion detection pattern 220, when adjusting the length L8, there is no need to change a width between the wirings.

Therefore, by using the corrosion detection pattern 220 according to the modification example 2, it is possible to provide the electronic apparatus 320 capable of adjusting the detection sensitivity of corrosion without changing the space required for mounting the corrosion detection pattern 220 and, similarly to the first embodiment, detecting corrosion with high sensitivity before a corrosion error occurs.

Modification Example 3

Figure 7:
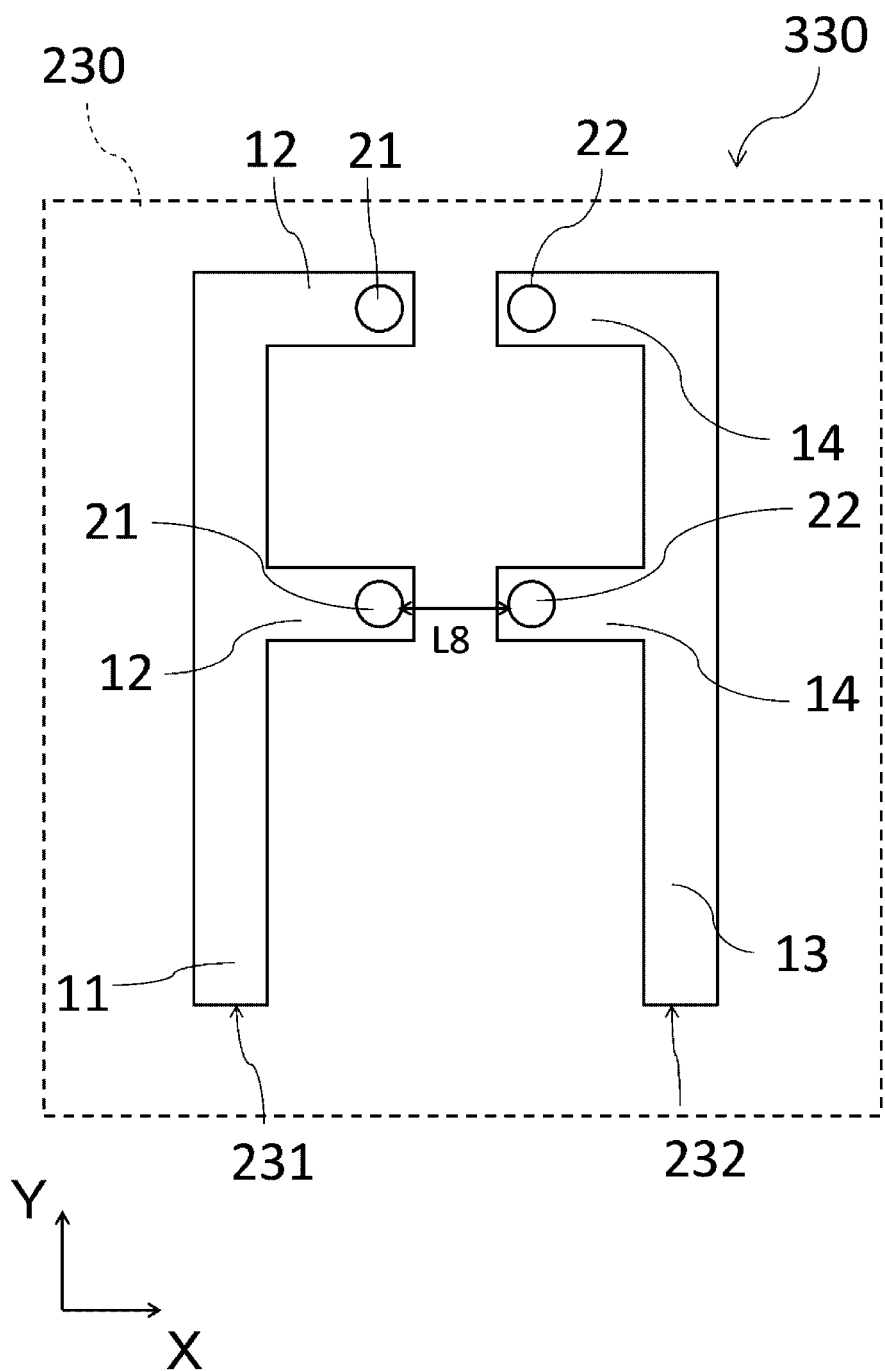
FIG. 7 is a schematic diagram illustrating a corrosion detection pattern according to a third modification example 3 of a first embodiment.

FIG. 7 is a schematic diagram illustrating a corrosion detection pattern 230 of an electronic apparatus 330 according to a modification example 3. The corrosion detection pattern 230 according to the modification example 3 is different from the corrosion detection pattern 200 according to the first embodiment in that the second wiring portion 12 and the fourth wiring portion 14 are separated from each other in the X direction and that one wiring portion of the second wiring portion 12 and the fourth wiring portion 14 is located on the tip end side of the other wiring portion.

The second wiring portion 12 and the fourth wiring portion 14 according to the modification example 3 extend in the X direction, and the tip ends of the second wiring portion 12 and the fourth wiring portion 14 face each other. The via 21 of the second wiring portion 12 and the via 22 of the fourth wiring portion 14 are provided side by side in the X direction. In the corrosion detection pattern 230, by adjusting the gap between the second wiring portion 12 and the fourth wiring portion 14 in the X direction, it is possible to adjust the length L8 as a gap between the adjacent vias 21 and 22.

By using the corrosion detection pattern 230 according to the modification example 3, similarly to the first embodiment, it is possible to provide the electronic apparatus 330 that detects corrosion with high sensitivity before a corrosion error occurs.

Modification Example 4

Figure 8:
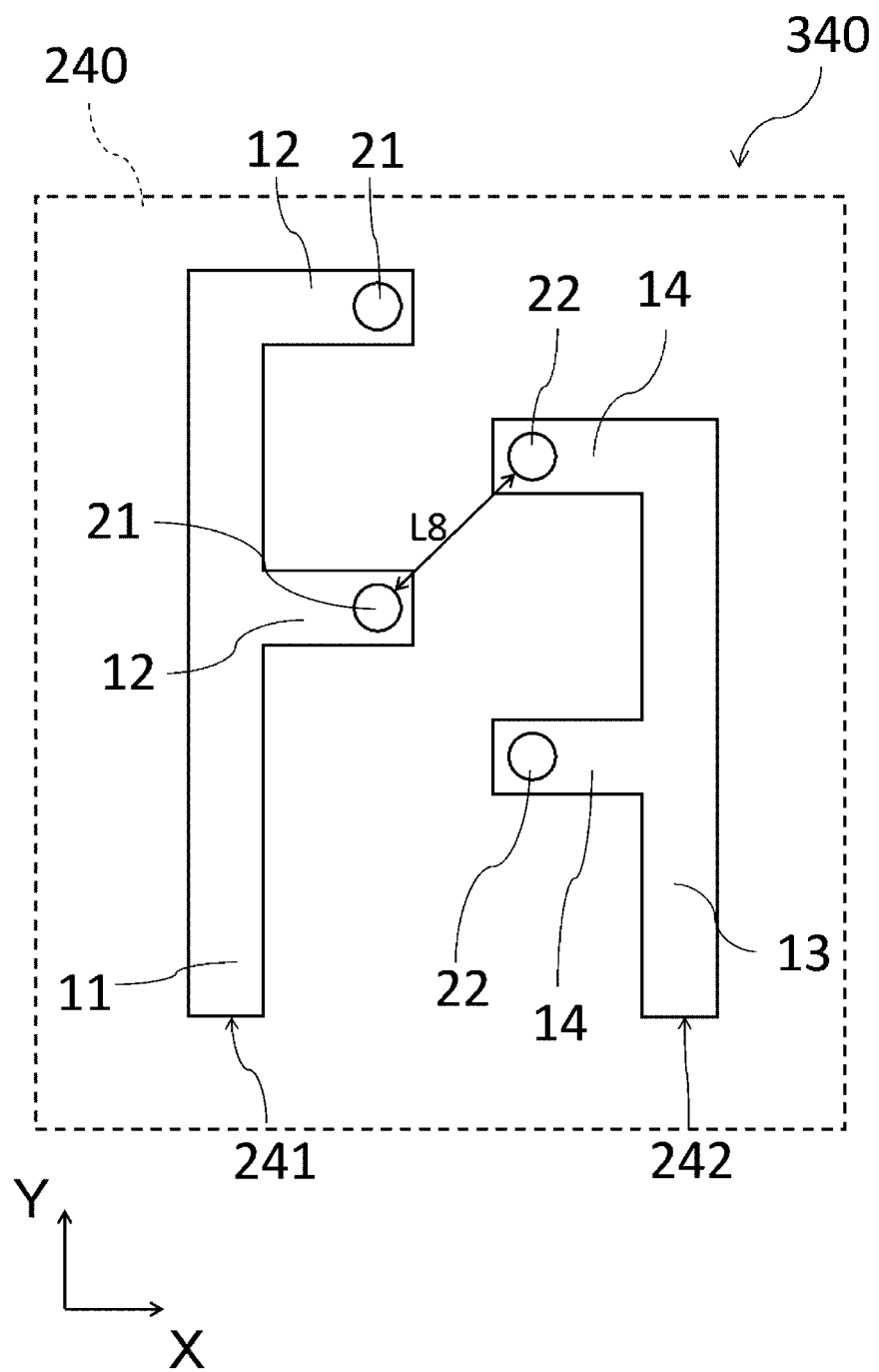
FIG. 8 is a schematic diagram illustrating a corrosion detection pattern according to a fourth modification example of a first embodiment.

FIG. 8 is a schematic diagram illustrating a corrosion detection pattern 240 of an electronic apparatus 340 according to a modification example 4. The corrosion detection pattern 240 according to the modification example 4 is different from the corrosion detection pattern 200 according to the first embodiment in that the second wiring portion 12 and the fourth wiring portion 14 are separated from each other in the X direction.

The second wiring portion 12 according to the modification example 4 extends in the X direction, and the third wiring portion 13 is located on the tip end side of the second wiring portion 12. The vias 21 of the second wiring portion 12 are provided side by side in the Y direction. The fourth wiring portion 14 extends in the X direction, and the first wiring portion 11 is located on the tip end side of the fourth wiring portion 14. The vias 22 of the fourth wiring portion 14 are provided side by side in the Y direction. As illustrated in FIG. 8, in the corrosion detection pattern 240, the vias 21 and 22 are arranged in a staggered manner. In the corrosion detection pattern 240, by changing the positions of the vias 21 and 22 in the X direction, or by changing the distance between the second wiring portion 12 and the fourth wiring portion 14 in the X direction and the Y direction, it is possible to adjust the length L8 as a distance between the vias 21 and 22.

By using the corrosion detection pattern 240 according to the modification example 4, it is possible to provide the electronic apparatus 340 capable of adjusting the detection sensitivity of corrosion and, similarly to the first embodiment, detecting corrosion with high sensitivity before a corrosion error occurs.

Modification Example 5

Figure 9:
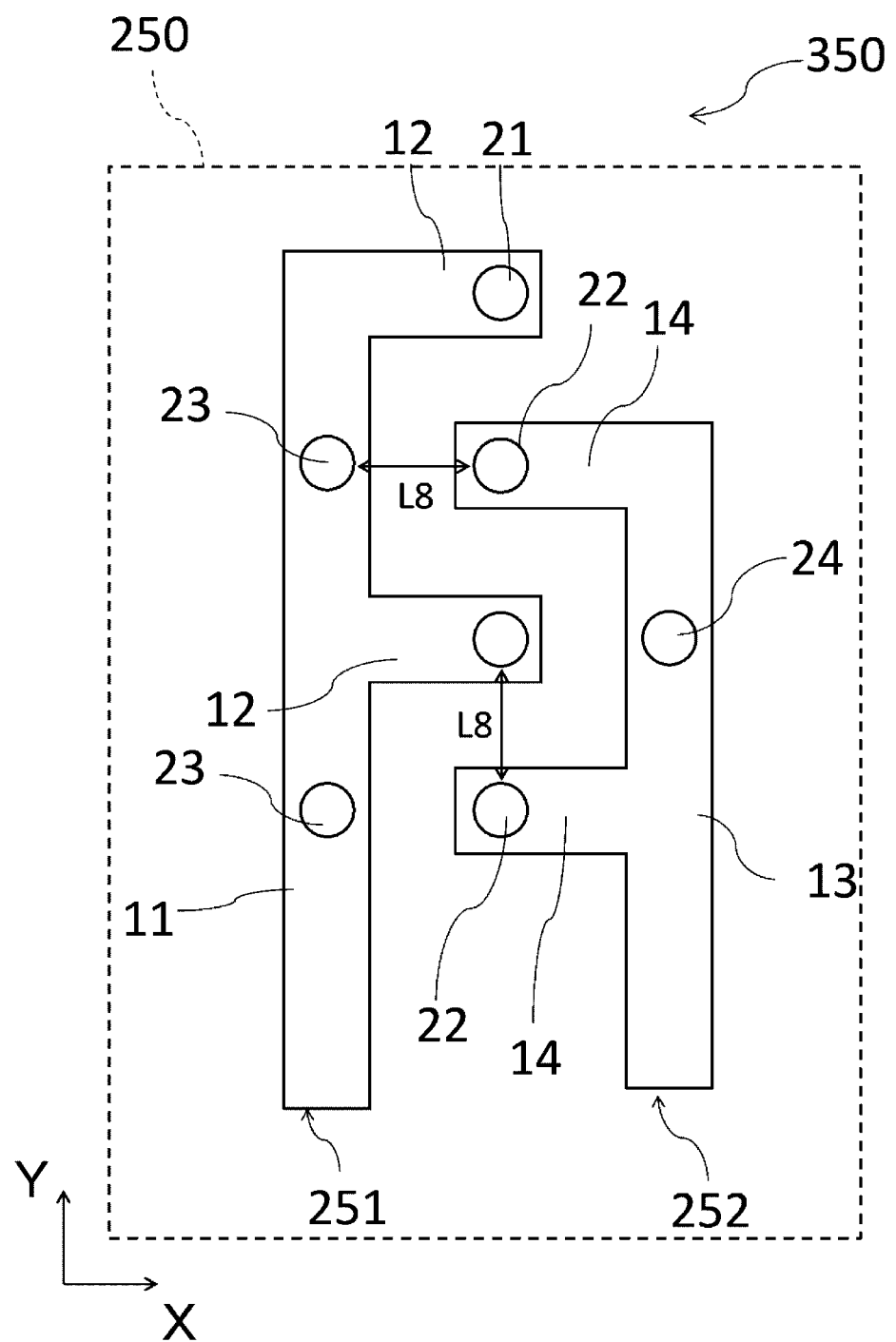
FIG. 9 is a schematic diagram illustrating a corrosion detection pattern according to a fifth modification example of a first embodiment.

FIG. 9 is a schematic diagram illustrating a corrosion detection pattern 250 of an electronic apparatus 350 according to a modification example 5. The corrosion detection pattern 250 according to the modification example 5 is different from the corrosion detection pattern 200 according to the first embodiment in that vias 23 are provided on the first wiring portion 11 and vias 24 are provided on the third wiring portion 13.

FIG. 9 illustrates an example in which the vias 23 and 24 are provided at the same positions as the vias 21 and 22 in the Y direction. However, the vias 23 and 24 may be provided at positions different from the positions of the vias 21 and 22. In the modification example 5, since the vias 23 and 24 are provided, the corrosion products generated from the vias 21 and 22 come into contact with the corrosion products generated from the vias of the other wiring patterns not only when growing in the Y direction but also when growing in the X direction, and as a result, a short circuit occurs.

By using the corrosion detection pattern 250 according to the modification example 5, it is possible to provide the electronic apparatus 350 capable of detecting corrosion with high sensitivity before a corrosion error occurs and improving detection accuracy of corrosion by reducing an influence of a growth direction of corrosion on an occurrence of a short circuit caused by contact between corrosion products.

Modification Example 6

Figure 10:
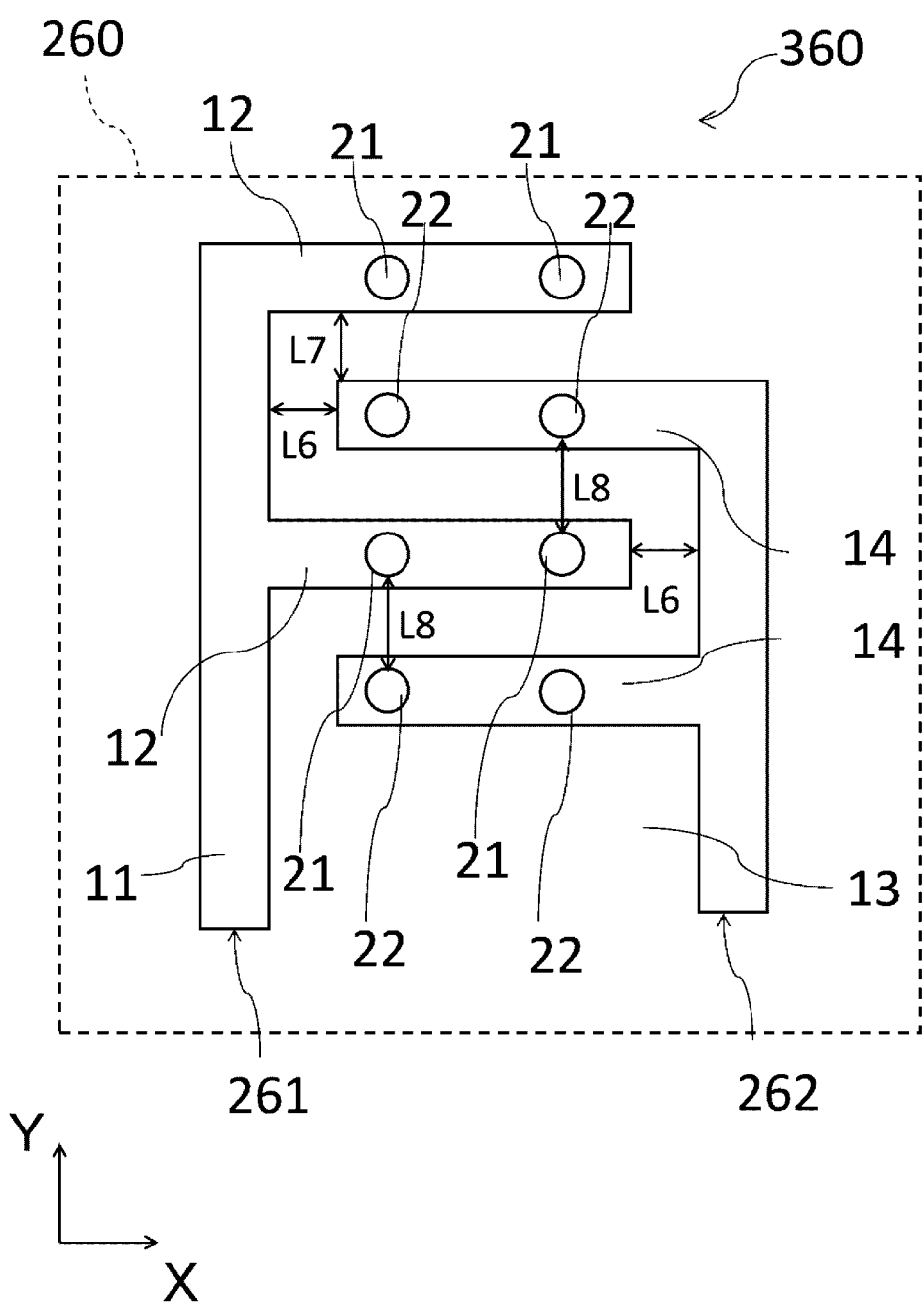
FIG. 10 is a schematic diagram illustrating a corrosion detection pattern according to a sixth modification example of a first embodiment.

FIG. 10 is a schematic diagram illustrating a corrosion detection pattern 260 of an electronic apparatus 360 according to a modification example 6. The corrosion detection pattern 260 according to the modification example 6 is different from the corrosion detection pattern 200 according to the first embodiment in that a plurality of vias 21 are provided on the second wiring portion 12, that a plurality of vias 22 are provided on the fourth wiring portion 14, and that the vias 21 and 22 are arranged side by side in a plurality of linear rows in the Y direction.

In the modification example 6, the number of the vias 21 and 22 is increased as compared with the first embodiment. Therefore, it is possible to increase a possibility of an occurrence of corrosion without increasing the number of the second wiring portions 12 and the fourth wiring portions 14. By using the corrosion detection pattern 260 according to the modification example 6, it is possible to provide the electronic apparatus 360 capable of detecting corrosion with high sensitivity before a corrosion error occurs and improving detection sensitivity of corrosion without increasing the space required for mounting the corrosion detection pattern 260.

Modification Example 7

Figure 11:
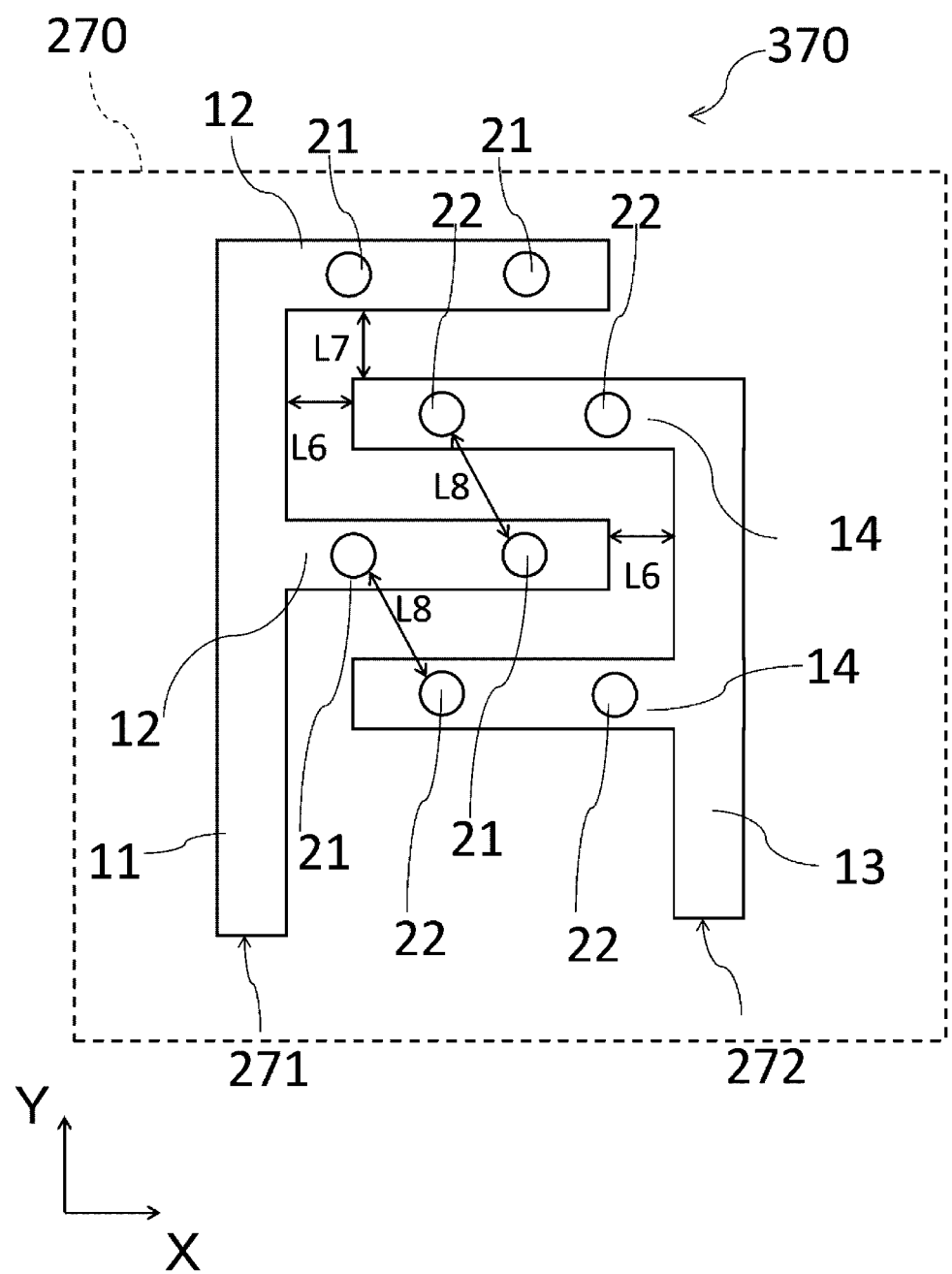
FIG. 11 is a schematic diagram illustrating a corrosion detection pattern according to a seventh modification example a of a first embodiment.

FIG. 11 is a schematic diagram illustrating a corrosion detection pattern 270 of an electronic apparatus 370 according to a modification example 7. The corrosion detection pattern 270 according to the modification example 7 is different from the corrosion detection pattern 200 according to the first embodiment in that a plurality of vias 21 are provided on the second wiring portion 12, that a plurality of vias 22 are provided on the fourth wiring portion 14, and that the vias 21 and 22 are arranged side by side in a plurality of rows in a staggered manner.

In the modification example 7, the number of vias 21 and 22 with respect to the number of the second wiring portions 12 and the fourth wiring portions 14 is increased as compared with the first embodiment. Therefore, it is possible to increase a possibility of an occurrence of corrosion without increasing the number of the second wiring portions 12 and the fourth wiring portions 14. By using the corrosion detection pattern 270 according to the modification example 7, it is possible to provide the electronic apparatus 370 capable of detecting corrosion with high sensitivity before a corrosion error occurs and improving detection sensitivity of corrosion without increasing the space required for mounting the corrosion detection pattern 270.

Modification Example 8

Figure 12:
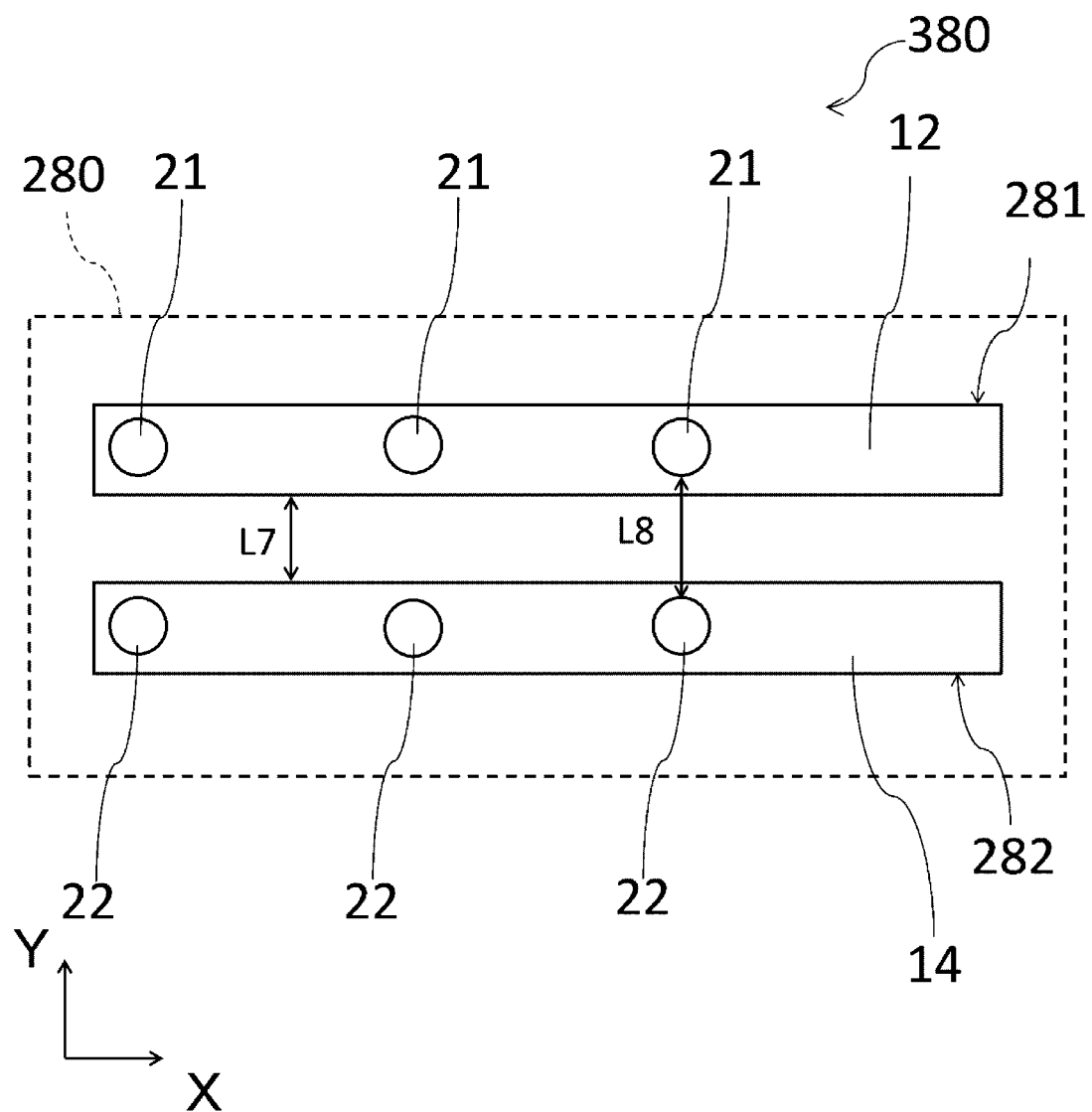
FIG. 12 is a schematic diagram illustrating a corrosion detection pattern according to an eighth modification example of a first embodiment.

FIG. 12 is a schematic diagram illustrating a corrosion detection pattern 280 of an electronic apparatus 380 according to a modification example 8. The corrosion detection pattern 280 according to the modification example 8 is different from the corrosion detection pattern 200 according to the first embodiment in that the first wiring portion 11 and the third wiring portion 13 are not provided and that the corrosion detection pattern 280 is configured with one second wiring portion 12 and one fourth wiring portion 14.

The second wiring portion 12 and the fourth wiring portion 14 according to the modification example 8 are separated from each other by the length L7 in the Y direction, and extend in the X direction. The via 21 and the via 22 are separated from each other by the length L8. Since the first wiring portion 11 and the third wiring portion 13 are not provided in the corrosion detection pattern 280, as compared with the corrosion detection pattern 200 according to the first embodiment, it is possible to reduce a width in the Y direction required for mounting the corrosion detection pattern 280. By using the corrosion detection pattern 280 according to the modification example 8, it is possible to provide the electronic apparatus 380 capable of detecting corrosion with high sensitivity before a corrosion error occurs and realizing a corrosion inspection function in a space smaller than the space in the first embodiment.

Modification Example 9

Figure 13:
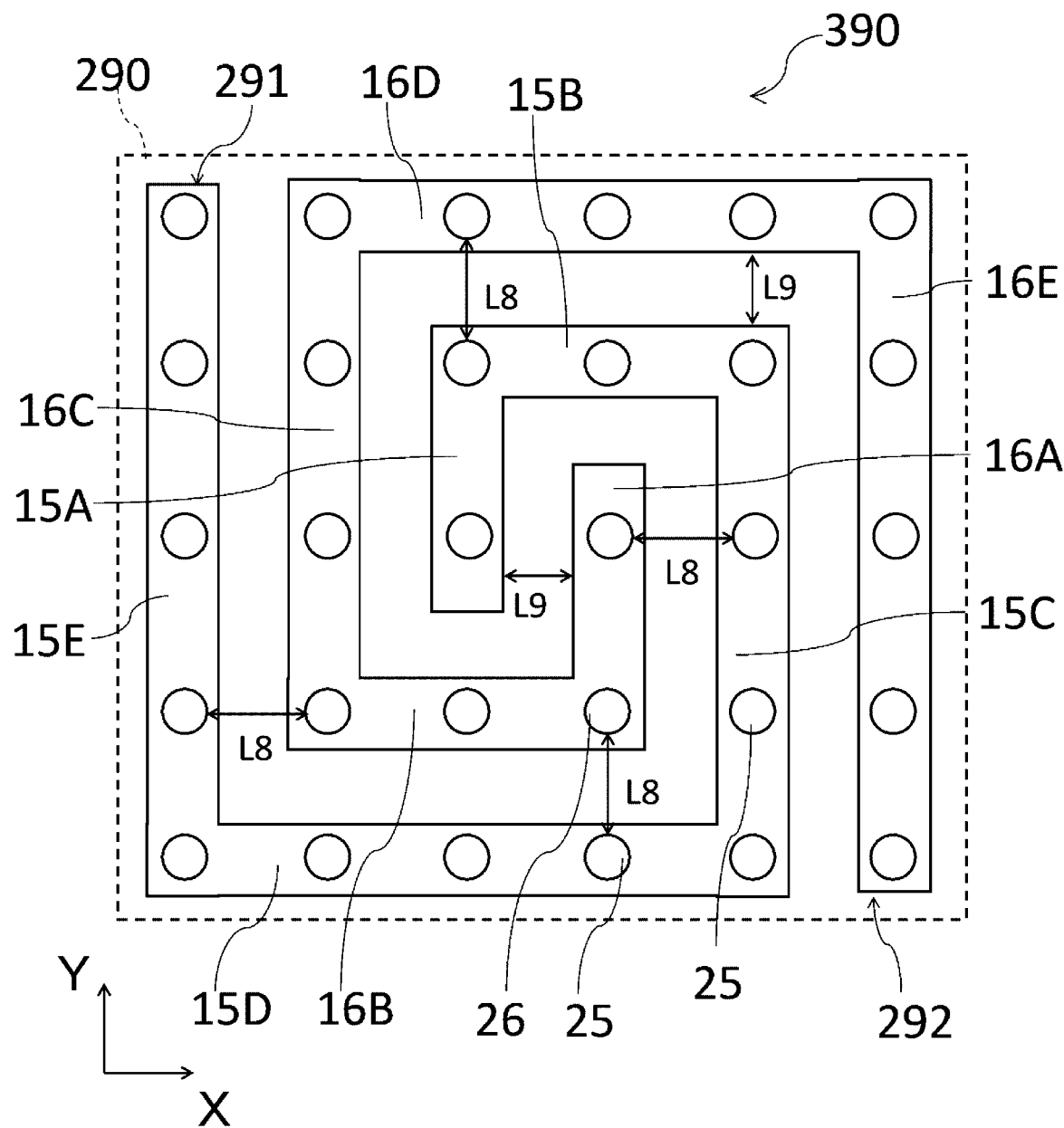
FIG. 13 is a schematic diagram illustrating a corrosion detection pattern according to a ninth modification example 9 of a first embodiment.

FIG. 13 is a schematic diagram illustrating a corrosion detection pattern 290 of an electronic apparatus 390 according to a modification example 9. The corrosion detection pattern 290 according to the modification example 9 is different from the corrosion detection pattern 200 according to the first embodiment in that the first wiring pattern 291 and the second wiring pattern 292 are separated from each other by a length L9, and that the corrosion detection pattern 290 has a spiral shape in which the first wiring pattern 291 and the second wiring pattern 292 are further away from the center as the first wiring pattern 291 and the second wiring pattern 292 turn.

The first wiring pattern 291 includes fifth wiring portions 15A, 15B, 15C, 15D, and 15E of which the ends are connected in this order. The fifth wiring portion 15E is a base end of the first wiring pattern 291, and is connected to the power supply circuit 110. The first wiring pattern 291 spirals around the end of the fifth wiring portion 15A. The fifth wiring portions 15A, 15C, and 15E extend in the Y direction, and the fifth wiring portions 15B and 15D extend in the X direction. The first wiring pattern 291 includes a plurality of vias 25.

The second wiring pattern 292 includes sixth wiring portions 16A, 16B, 16C, 16D, and 16E of which the ends are connected in this order. The sixth wiring portion 16E is a base end of the second wiring pattern 292, and is connected to the current detection circuit 120. The second wiring pattern 292 spirals around the end of the sixth wiring portion 16A. The sixth wiring portions 16A, 16C, and 16E extend in the Y direction, and the sixth wiring portions 16B and 16D extend in the X direction. The second wiring pattern 292 includes a plurality of vias 26, which are separated from the vias 25 by a length L8.

The fifth wiring portion 15E, the sixth wiring portion 16C, the fifth wiring portion 15A, the sixth wiring portion 16A, the fifth wiring portion 15C, and the sixth wiring portion 16E are separated from each other by a length L9 in the X direction in this order. The sixth wiring portion 16D, the fifth wiring portion 15B, and the sixth wiring portion 16A are separated from each other by the length L9 in the Y direction in this order. The fifth wiring portion 15D, the sixth wiring portion 16B, and the fifth wiring portion 15A are separated from each other by the length L9 in the Y direction in this order.

Similarly to the second wiring portion 12 and the fourth wiring portion 14 according to the first embodiment, the first wiring pattern 291 and the second wiring pattern 292 according to the modification example 9 are separated from each other by a predetermined length. Further, similarly to the first embodiment, one wiring pattern of the first wiring pattern 291 and the second wiring pattern 292 according to the modification example 9 includes wirings located between two wirings of the other wiring pattern extending in the same direction (the fifth wiring portions 15A, 15B, and 15C or the sixth wiring portions 16A, 16B, and 16C). For example, the first wiring pattern 291 includes the fifth wiring portion 15C located between the sixth wiring portions 16A and 16E of the second wiring pattern 292 extending in the same direction (Y direction).

When corrosion occurs in the fifth wiring portions 15A, 15B, and 15C and the sixth wiring portions 16A, 16B, and 16C, even though the corrosion product grows in any direction, the corrosion product comes into contact with the wiring of the other wiring pattern, and as a result, a short circuit occurs. Further, the distance between the vias 25 and 26 is the length L8, which is the same as the distance between the vias 21 and 22 in the first embodiment. Therefore, even in the modification example 9, before a corrosion error occurs, a short circuit occurs due to a contact between the corrosion products generated from the vias 25 and 26.

FIG. 13 illustrates an example in which the first wiring pattern 291 and the second wiring pattern 292 include a plurality of wirings extending in the X direction and the Y direction, and the present disclosure is not limited thereto. The first wiring pattern 291 and the second wiring pattern 292 may include, for example, curved wirings having a spiral shape, and a part of the wirings may be located between two parts of the other wiring pattern. The direction in which the first wiring pattern 291 and the second wiring pattern 292 spiral may be a direction in which the first wiring pattern 291 and the second wiring pattern 292 are further away from the center as the first wiring pattern 291 and the second wiring pattern 292 turn clockwise, or may be a direction in which the first wiring pattern 291 and the second wiring pattern 292 are further away from the center as the first wiring pattern 291 and the second wiring pattern 292 turn counterclockwise.

By using the corrosion detection pattern 290 according to the modification example 9, similarly to the first embodiment, it is possible to provide the electronic apparatus 390 capable of detecting corrosion with high accuracy and high sensitivity before a corrosion error occurs.

In the first embodiment and the modification examples 1 to 9, various wirings of the first wiring pattern and the second wiring pattern are provided along the X direction or the Y direction orthogonal to the X direction. However, the wirings may be provided on a plane formed by the X direction and the Y direction along two or more directions crossing each other.

In the first embodiment and the modification examples 1 to 9, the protective layer 102 is not provided on the corrosion detection pattern. However, in other examples, the protective layer 102 may be provided on some part or all of the wirings of the corrosion detection pattern, and the corrosion inspection may be performed under a condition more similar to the condition of the internal circuit wirings 101.

Gold is a metal that is unlikely to react with sulfur and is difficult to corrode. Thus, by applying gold plating on the upper surface of the metal foil of the wirings, it is possible to obtain the same effect as the protective layer that protects the wirings from substances causing corrosion. In the first embodiment and the modification examples 1 to 9, both a protective layer 102 made of an insulating resin material and a gold plating can be provided on the internal circuit wirings. When both of an insulating resin material and gold plating are applied on the internal circuit wirings, both the insulating resin material and the gold plating may be applied over the corrosion detection pattern, just one of the insulating resin material and the gold plating may be applied on the corrosion detection pattern, or neither may be applied.

In the first embodiment and the modification examples 1 to 9, the start signal output circuit 140 need not necessarily include the time measurement unit 141 and the start signal generation unit 142. The start signal output circuit 140 may include, for example, an oscillator and a counter to which an output of the oscillator is input, and may output a start signal every time a counter value reaches a predetermined value. That is, the start signal output circuit 140 does not necessarily need to determine the elapsed time per se, but rather may operate on the basis of an arbitrary count. In addition, when the start signal output circuit 140 outputs start signals at intervals, the start signal output intervals need not necessarily be constant. Further, the start signal output circuit 140 does not need to be a dedicated circuit in the power supply circuit 110. For example, a part or the entire of the start signal output circuit 140 may be implemented by a counter circuit, a time measurement circuit, a clock signal output circuit, and the like of the electronic apparatus 300 so as to output start signals at predetermined intervals.

As described above, according to the first embodiment and the modification examples 1 to 9, the electronic apparatus includes the corrosion detection pattern including the first wiring pattern and the second wiring pattern on which the vias are provided and therefore corrosion is likely to occur at these points. The electronic apparatus applies a voltage between the first wiring pattern and the second wiring pattern every time a predetermined time increment is elapsed, and determines at these times whether or not a current flows between the two wiring patterns. Therefore, the electronic apparatus can detect an occurrence of a short circuit due to corrosion in the corrosion detection pattern. According to the first embodiment and the modification examples 1 to 9, it is possible to provide the electronic apparatus capable of detecting, with high sensitivity, an occurrence of corrosion on a wiring board before a corrosion error occurs by detection of a short circuit due to corrosion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus, comprising:
a wiring board;
a first wiring pattern on the wiring board and including a first wiring portion extending in a first direction;
a second wiring pattern on the wiring board and including a second wiring portion adjacent to the first wiring portion in a second direction intersecting with the first direction, the second wiring portion extending in the first direction;
a first via on the first wiring portion;
a second via on the second wiring portion;
a power supply circuit configured to apply a first voltage to the first wiring portion at time intervals;
a detection circuit that is electrically connected to the second wiring pattern and configured to output an alert signal when a current is detected flowing through the second wiring pattern when the first voltage is being applied to the first wiring portion; and
a protective layer formed of a resin material, wherein
the first wiring pattern and the second wiring pattern are not covered by the protective layer,
the first wiring pattern further includes a third wiring portion that extends in the second direction and a fourth wiring portion that is separated from the first wiring portion in the second direction, a third via being on the fourth wiring portion,
the second wiring pattern further includes a fifth wiring portion that extends in the second direction and a sixth wiring portion that is separated from the second wiring portion in the second direction, a fourth via being on the sixth wiring portion,
the first wiring portion and the fourth wiring portion each have one end connected to the third wiring portion,
the first wiring portion and the fourth wiring portion each extend toward the fifth wiring portion in the first direction,
the second wiring portion and the sixth wiring portion each have one end connected to the fifth wiring portion, and
the second wiring portion and the sixth wiring portion each extend toward the third wiring portion in the first direction.

2. The electronic apparatus according to claim 1, wherein the fourth wiring portion is between the second wiring portion and the sixth wiring portion in the second direction, and is adjacent to the second wiring portion and the sixth wiring portion in the second direction, and the sixth wiring portion is between the first wiring portion and the fourth wiring portion in the second direction, and is adjacent to the first wiring portion and the fourth wiring portion in the second direction.

3. The electronic apparatus according to claim 1, further comprising:
a seventh wiring portion that is between the wiring board and the protective layer; and
an eighth wiring portion that is between the wiring board and the protective layer and is adjacent to the seventh wiring portion.

4. The electronic apparatus according to claim 3, wherein the first via and the second via are separated from each other by a first length, the seventh wiring portion and the eighth wiring portion are separated from each other by a second length in a direction orthogonal to a direction in which the seventh wiring portion extends, and one-half the first length is less than the second length.

5. The electronic apparatus according to claim 3, wherein
the first wiring portion and the second wiring portion are separated from each other by a third length,
the seventh wiring portion and the eighth wiring portion are separated from each other by a second length in a direction orthogonal to a direction in which the seventh wiring portion extends, and
the third length is less than the second length.

6. The electronic apparatus according to claim 1, wherein the power supply circuit includes a transistor with one of a source or a drain connected to a power supply voltage and the other of the source or the drain electrically connected to the first wiring pattern.

7. The electronic apparatus according to claim 1, wherein the detection circuit includes:
a resistor connected between the second wiring pattern and a ground voltage, and
a comparator with a first input terminal electrically connected to the second wiring pattern and the resistor and a second input terminal connected to a predetermined reference voltage, the alert signal being supplied from an output terminal of the comparator.

8. The electronic apparatus according to claim 7, wherein the comparator comprises an operational amplifier circuit.

9. The electronic apparatus according to claim 1, further comprising:
an electronic device circuit on the wiring board separated from the first and second wiring patterns.

10. An electronic apparatus, comprising:
a wiring board including an electronic device circuit covered by a protective layer;
a first wiring pattern on the wiring board, spaced from the electronic device circuit and not covered by the protective layer, the first wiring pattern including a first wiring portion extending in a first direction;
a second wiring pattern on the wiring board, spaced from the electronic device circuit and not covered by the protective layer, the second wiring pattern including a second wiring portion adjacent to the first wiring portion in a second direction intersecting with the first direction and extending in the first direction;
a power supply circuit configured to apply a first voltage to the first wiring portion at time intervals; and
a detection circuit that is electrically connected to the second wiring pattern and configured to supply an alert notification when a current flows through the second wiring pattern when the first voltage is being applied to the first wiring portion, wherein
the first wiring pattern further includes a third wiring portion that extends in the second direction and a fourth wiring portion that is separated from the first wiring portion in the second direction,
the second wiring pattern further includes a fifth wiring portion that extends in the second direction and a sixth wiring portion that is separated from the second wiring portion in the second direction,
the first wiring portion and the fourth wiring portion each have one end connected to the third wiring portion and extend toward the fifth wiring portion in the first direction, and
the second wiring portion and the sixth wiring portion each have one end connected to the fifth wiring portion, and extend toward the third wiring portion in the first direction.

11. The electronic apparatus according to claim 10, wherein the protective layer comprises a resin material.

12. The electronic apparatus according to claim 10, wherein
the fourth wiring portion is between the second wiring portion and the sixth wiring portion in the second direction, and is adjacent to the second wiring portion and the sixth wiring portion in the second direction, and
the sixth wiring portion is between the first wiring portion and the fourth wiring portion in the second direction and is adjacent to the first wiring portion and the fourth wiring portion in the second direction.

13. The electronic apparatus according to claim 10, further comprising:
a seventh wiring portion that is between the wiring board and the protective layer; and
an eighth wiring portion that is between the wiring board and the protective layer and is adjacent to the seventh wiring portion.

14. The electronic apparatus according to claim 13, wherein
the seventh wiring portion and the eighth wiring portion are separated from each other by a second length in a direction orthogonal to a direction in which the seventh wiring portion extends, and
the first length is greater than the second length but less than twice the second length.

15. The electronic apparatus according to claim 13, wherein
the first wiring portion and the second wiring portion are separated from each other by a third length,
the seventh wiring portion and the eighth wiring portion are separated from each other by a second length in a direction orthogonal to a direction in which the seventh wiring portion extends, and
the third length is less than the second length.

16. The electronic apparatus according to claim 10, further comprising:
a first via on the first wiring portion; and
a second via on the second wiring portion.

* * * * *